(12) United States Patent
Reed

(10) Patent No.: US 8,217,352 B2
(45) Date of Patent: Jul. 10, 2012

(54) PONDEROMOTIVE PHASE PLATE FOR TRANSMISSION ELECTRON MICROSCOPES

(75) Inventor: Bryan W. Reed, Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 141 days.

(21) Appl. No.: 12/881,075

(22) Filed: Sep. 13, 2010

(65) Prior Publication Data

US 2011/0220791 A1 Sep. 15, 2011

Related U.S. Application Data

(60) Provisional application No. 61/241,792, filed on Sep. 11, 2009.

(51) Int. Cl.
*G01N 23/04* (2006.01)
(52) U.S. Cl. ......... 250/311; 250/306; 250/307; 250/310
(58) Field of Classification Search .................. 250/306, 250/307, 310, 311
See application file for complete search history.

(56) References Cited

U.S. PATENT DOCUMENTS

| | | | |
|---|---|---|---|
| 6,440,620 B1 | 8/2002 | Katsap et al. | |
| 6,770,887 B2 | 8/2004 | Krivanek et al. | |
| 6,940,080 B2 | 9/2005 | Nagano et al. | |
| 2010/0108883 A1* | 5/2010 | Zewail | 250/307 |

OTHER PUBLICATIONS

Dhaliwal, et al., "Prevail Electron Projection Technology Approach for Next-Generation Lithography", IBM J. Res. & dev., vol. 45, No. 5, pp. 615-638 (Sep. 2001).

Yamabe, "Status and issues of electron projection lithography", J. Microlith, Microfab, Microsyst. 4(1), 011005-1 through 011005-10 (Jan.-Mar. 2005).
Lobastov, et al., "Four-dimensional ultrafast electron microscopy", PNAS, vol. 102, pp. 7069-7073 (May 17, 2005).
LaGrange, et al., "Single-Shot Dynamic Transmission Electron Microscopy", Applied Physics Letters, 89, 3 pages (2006).
Baum, et al., "Attosecond electron pulses for 4D diffraction and microscopy", PNAS, vol. 104, No. 47 18409-18414 (Nov. 20, 2007).
Hebeisen, et al., "Femtosecond electron pulse characterization using laser ponderomotive scattering", Optics Letters, vol. 31, No. 23, pp. 3517-3519 (Dec. 1, 2006).
Schroder, et al., "Contrast Enhancement by Anamorphotic Phase Plates in an Aberration Corrected TEM", Microssc Microanal 13, (Suppl 2), pp. 136-137 (2007).
LaGrange, et al., Nanosecond time-resolved investigations using the in situ of dynamic transmission electron microscope (DTEM), Ultramicroscopy, 108, pp. 1441-1449 (2008).
Nagayama, et al., "Phase Contrast Electron Microscopy Development of Thin-Film Phase Plates and Biological Applications", Phil. Trans. B Soc. B, pp. 2153-2162 (2008).
Hilbert, et al., "Temporal lenses for attosecond and femtosecond electron pulses", PNAS, vol. 106, No. 26, pp. 10558-10563 (Jun. 30, 2009).

* cited by examiner

*Primary Examiner* — Michael Maskell
(74) *Attorney, Agent, or Firm* — James S. Tak

(57) ABSTRACT

A ponderomotive phase plate system and method for controllably producing highly tunable phase contrast transfer functions in a transmission electron microscope (TEM) for high resolution and biological phase contrast imaging. The system and method includes a laser source and a beam transport system to produce a focused laser crossover as a phase plate, so that a ponderomotive potential of the focused laser crossover produces a scattering-angle-dependent phase shift in the electrons of the post-sample electron beam corresponding to a desired phase contrast transfer function.

20 Claims, 5 Drawing Sheets

PONDEROMOTIVE PHASE PLATE FOR TRANSMISSION ELECTRON MICROSCOPES

CLAIM OF PRIORITY IN PROVISIONAL APPLICATION

This application claims priority in provisional application filed on Sep. 11, 2009, entitled "Pulsed Ponderomotive Phase Plate (PPPP)" Ser. No. 61/241,792, by Bryan W. Green.

I. FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

II. FIELD OF THE INVENTION

The present invention relates to transmission electron microscopes ("TEM"), and more particularly to a ponderomotive phase plate system and method for use in a TEM as an integrated sub-system thereof which introduces a scattering angle-dependent phase shift in an electron wave based on the ponderomotive effect of a laser crossover beam at a diffraction plane downstream of an interrogated sample to produce highly tunable contrast transfer functions for high resolution and biological phase contrast imaging.

III. BACKGROUND OF THE INVENTION

Phase-contrast imaging is an imaging method commonly used for high resolution and biological imaging in TEMs. Phase-contrast imaging produces two-dimensional phase-resolved images based on the phase shifts/delays experienced by electron wave fronts as they pass through various parts of a material, i.e. the sample/specimen). Because a perfect, focused lens does not produce phase contrast, the technique typically requires that images be taken slightly out of focus, or with an imperfect lens, or (more rarely) by using holographic techniques. These methods, however, are known to have significant drawbacks in terms of the phase contrast transfer function ("CTF"), such as the loss of information at low spatial frequencies, and contrast reversals and oversensitivity to incoherence at high spatial frequencies.

Other prior art methods of phase-contrast imaging have included the use of phase plates, which function to delay/shift the electron beam (in the axial direction thereof) by producing a 90 degree phase shift between low-angle and high-angle scattered electrons, and which are typically provided as a physical structure positioned at the back focal plane of the objective lens. Mathematically, the back focal plane corresponds to a two-dimensional Fourier space characterizing the diffraction or the spatial frequency. Thus, the manipulation of frequency components at the back focal plane by the phase plates is equivalent to spatial filtering that is in turn able to manage phase contrast. For example, one known type of phase plate is a Boersche phase plate, which comprises a pair of ring electrodes separated by a dielectric with an aperture in the center of the inner electrode for electrons to pass through. In this case, low-angle scattered electrons passing through the aperture in the center of the inner electrode experience a 90 degree phase shift, while high-angle scattered electrons are not considered. Another similar phase plate is known as a Ziernike phase plate having a thin film with a central aperture. Similar to the Boersch phase plate, the low-frequency limit is determined by the size of the aperture in the center.

Many of the prior art methods using a physical phase plate have significant drawbacks in terms of the CTF, such as the loss of information at low spatial frequencies and contrast reversals and oversensitivity to incoherence at high spatial frequencies. Physical phase plates, which produce a 90 degree phase shift between low-angle and high-angle scattered electrons, can bypass some of these problems but introduce problems of their own. For example, the physical phase plate itself can cause incoherent scattering, and intermediate spatial frequency information may be totally lost. Moreover, the physical phase plate may experience contamination. Despite these limitations, however, phase plates are considered as an important advance for improving the CTF curves in high-resolution and biological TEM. However, there is still a need for a phase plate system that does not suffer from these limitations.

IV. SUMMARY OF THE INVENTION

One aspect of the present invention includes a ponderomotive phase plate system for use in a transmission electron microscope (TEM) for high-resolution phase contrast imaging, comprising: a laser source for producing a laser beam; and means for transporting said laser beam into a post-sample electron beam drift space of a post-condenser lens system of said TEM as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

Another aspect of the present invention includes an improved transmission electron microscope (TEM) for high-resolution phase contrast imaging, said TEM of a type having an electron source for producing an electron beam, an accelerator for accelerating the electron beam, a condenser lens system for primary beam formation of the electron beam, a sample stage for holding a sample, a post-condenser lens system for focusing the electron beam onto the sample and projecting the post-sample electron beam, and a camera for imaging the sample from the projected post-sample electron beam, the improvement comprising: a laser source for producing a laser beam; and means for transporting said laser beam into a post-sample electron beam drift space of the post-condenser lens system via a port in a post-condenser lens body thereof as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

Another aspect of the present invention includes a method of controlling a phase-contrast transfer function of a transmission electron microscope (TEM) for high-resolution phase contrast imaging, comprising: transporting said laser beam into a post-sample electron beam drift space of a post-condenser lens system of said TEM as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

Generally, the present invention is directed to a ponderomotive phase plate system ("PPP system") for use in a high resolution TEM, an improved TEM system including the PPP system as an integrated sub-system thereof, and a method of using the ponderomotive potential of a focused laser crossover to produce a highly tunable CTF of a TEM, for high-resolution and biological phase contrast imaging. The invention enables high-contrast high-resolution phase contrast images with directly interpretable information from a very wide range of spatial frequencies with none of the deleterious effects introduced by conventional phase plate structures. It is appreciated that the CTF describes the amount of optical information transfer as a function of the spatial frequency. The CTF oscillates with an initial value of zero at the origin of the frequency or the center of the diffraction space (k-space), thus acting as a band-pass filter. Lower frequency components are highly suppressed.

The PPP system includes two main components, including a laser source for producing a laser beam, and a beam transport system for transporting the laser beam into the TEM column as a focused laser crossover that is synchronized (with appropriate time delays for electron and photon propagation) to an electron beam propagating through the TEM column and aligned to intersect and partially overlap the electron beam emerging from a sample (i.e. post-sample electron beam) at a diffraction plane of a post-condenser lens system, so that the ponderomotive potential of the focused laser crossover causes a scattering-angle dependent phase shift in the scattered electrons of the post-sample electron beam. The laser source may be of a type that produces a pulsed laser beam, or a continuous wave (CW) laser. It is appreciated, however, that pulsed operation enables the laser to deliver higher powered laser beams, to achieve higher spatial and temporal resolution than CW operation.

And the beam transport system may be adapted to transport the laser beam into a post-sample electron beam drift space of the post-condenser lens system, and to produce the focused laser crossover at or near a diffraction plane of the post-condenser lens system (e.g. objective lens back focal plane), or at or near an image of this focal point occurring further down the column (other operating modes, e.g. streak diffraction, may require the laser to be introduced at different places). For example, the ponderomotive laser beam may be introduced as a replacement for or modification of the objective aperture (a standard component in a TEM) or through a horizontal port normally used for X-ray detection (as exists on many microscopes). The laser enters the TEM column via either a transparent window or a fiber optic or waveguide and is focused to the appropriate point with a high-numerical aperture lens (possibly cylindrical to produce a line focus). In one example embodiment, a beam transport arm is insertably connected to a port of a post-condenser lens body. In another embodiment, a second beam transport system may be provided to produce a second laser beam in the post-sample electron beam drift space as a second focused laser crossover that intersects and partially overlaps the post-sample electron beam at the diffraction plane substantially transverse to the first laser beam, so that the ponderomotive potentials of the first and second focused laser crossovers produce the scattering-angle-dependent phase shift. It is appreciated that the beam transport system includes any combination of optical and electro-mechanical devices (e.g. piezoelectric) and implements known in the art (which may be either internal or external to the column), such a mirrors and alignment devices, for aligning, focusing, and otherwise transporting beams, and in particular so that the focused laser crossover is made to coincide with the electrons that experienced little or no net angular deflection on passing through the sample.

A spatial profile controller may also be provided to control the spatial profile and convergence geometry of the laser and thus the phase contrast transfer function. By controlling the spatial profile of the focused laser crossover, the scattering-angle-dependent phase shift may be tailored (controlled) to achieve a corresponding desired phase contrast transfer function. It is appreciated that a spatial profile controller may be for example a computer, processor, or other system (including actuators), by which various parameters of the laser crossover may be controlled, including the laser wavelength, convergence angel, convergence geometry, mode quality, and spatial coherence. Furthermore, convergence geometry means the laser entry points, use of shaped mirrors and cavities, as well as beam splitting to produce multiple beams all crossing the scattered electron beam.

Optionally, the PPP system of the present invention may also include a post-condenser lens body having an access port through which the beam transport system enters the post-condenser lens body and the ponderomotive laser beam is transported and focused. The post-condenser lens body is a preferably a standalone structural unit that may be incorporated as a component part of the TEM column. It may be provided as either (1) the objective lens body, or (2) as an intermediate lens body following the objective lens.

Furthermore, a beam dump, preferably easily replaceable, may also be provided and positioned beyond the laser crossover in order to absorb the laser energy, preventing damage to the other parts of the TEM. Alternately, the laser is used to excite and maintain a standing wave in a resonant cavity with the appropriate spatial profile for the application.

As such, it is appreciated that unlike the prior art, the phase plate produced by the PPP system is not a physical structure, but is rather a virtual phase plate formed from the photons of the focused laser crossover, and not atoms. Thus by controlling a spatial profile of the laser crossover to control the ponderomotive potential, the phase-contrast transfer function of the TEM may likewise be controlled. In this manner, the invention is capable of producing all of the advantages of a conventional phase plate with none of the disadvantages. For example, since the phase plate is made of photons instead of atoms, it cannot accumulate contamination and it won't produce any significant incoherent scattering.

It is appreciated that a diffraction plane is a location in the TEM column that contains a diffraction pattern (i.e. an image of the scattering density of the sample in reciprocal space, such that position in the diffraction plane corresponds to scattering angles in the sample, which to a first approximation correspond to spatial frequencies in the sample). The first diffraction plane is, to a good approximation, located at the back focal plane of the objective lens, and frequently the distinction between these two planes is neglected. The first diffraction plane is usually a very small fraction of a millimeter above or below the back focal plane, depending on the beam convergence incident on the sample. Therefore the ponderomotive phase plate can be designed to produce a laser crossover at the objective lens back focal plane, plus or minus small alignment corrections controlled by tiltable mirrors that are a standard part of a typical laser system. The imaging lens system is a compound electron lens, with multiple crossovers (depending on the magnification setting) and a diffraction plane located essentially at each crossover. Thus the ponderomotive laser could also be introduced later in the column, at any of these diffraction planes. In general the diffraction pattern will have a different magnification at each diffraction plane, which affects the laser parameters required to achieve good phase plate performance; it may be easier in some cases and more difficult in others. Fine adjustments of intermediate lens strengths offer an additional way of moving the later diffraction planes up and down, giving additional control over the alignment of the system. However, the engineering difficulties of introducing a laser into the intermediate lens system are substantial for many TEM column designs. Thus the decision as to where to introduce the laser will depend on a number of physical and engineering considerations, yet the essential principle of the device remains unchanged.

The PPP system may be used with various types of TEMs. In particular the PPP system is ideally suited to the high-peak-current low-duty-cycle TEM types/techniques such as a dynamic transmission electron microscope (DTEM) or ultrafast transmission electron microscope (UFTEM) since they operate with very small duty cycles and the ponderomotive laser beam only needs to be present when electrons are actually passing through. In particular, this invention would work in concert with a modification to produce a pulsed drop-in replacement for a conventional electron gun. It is appreciated that the ponderomotive phase plate system may also be used with conventional TEMs if a suitable laser with sufficient optical power (e.g. in the kilowatt range) is available, or if the laser is just being used to "top off" a high-Q resonant cavity, (which would be a very challenging engineering problem but in principle possible).

This PPP system and method can be used (e.g. in a modified DTEM) to achieve real-space imaging at currently impossible levels of spatiotemporal resolution for low-contrast samples such as biological materials. It could also be used for high-resolution high-contrast imaging of static biological samples, even without making use of the time resolution, by providing the benefits of a phase plate without the drawbacks of conventional phase plate designs. The PPPP could augment existing cryo-TEM systems. The PPP system could in principle also be used in a variety of non-standard operating modes, enabling very unusual two-dimensional contrast transfer functions, streak-camera-like operation, and (potentially) electron lens aberration correction including chromatic aberration correction in a picosecond TEM.

V. BRIEF DESCRIPTION OF THE DRAWINGS

The accompanying drawings, which are incorporated into and form a part of the disclosure, are as follows.

VI. DETAILED DESCRIPTION

Figure 1:
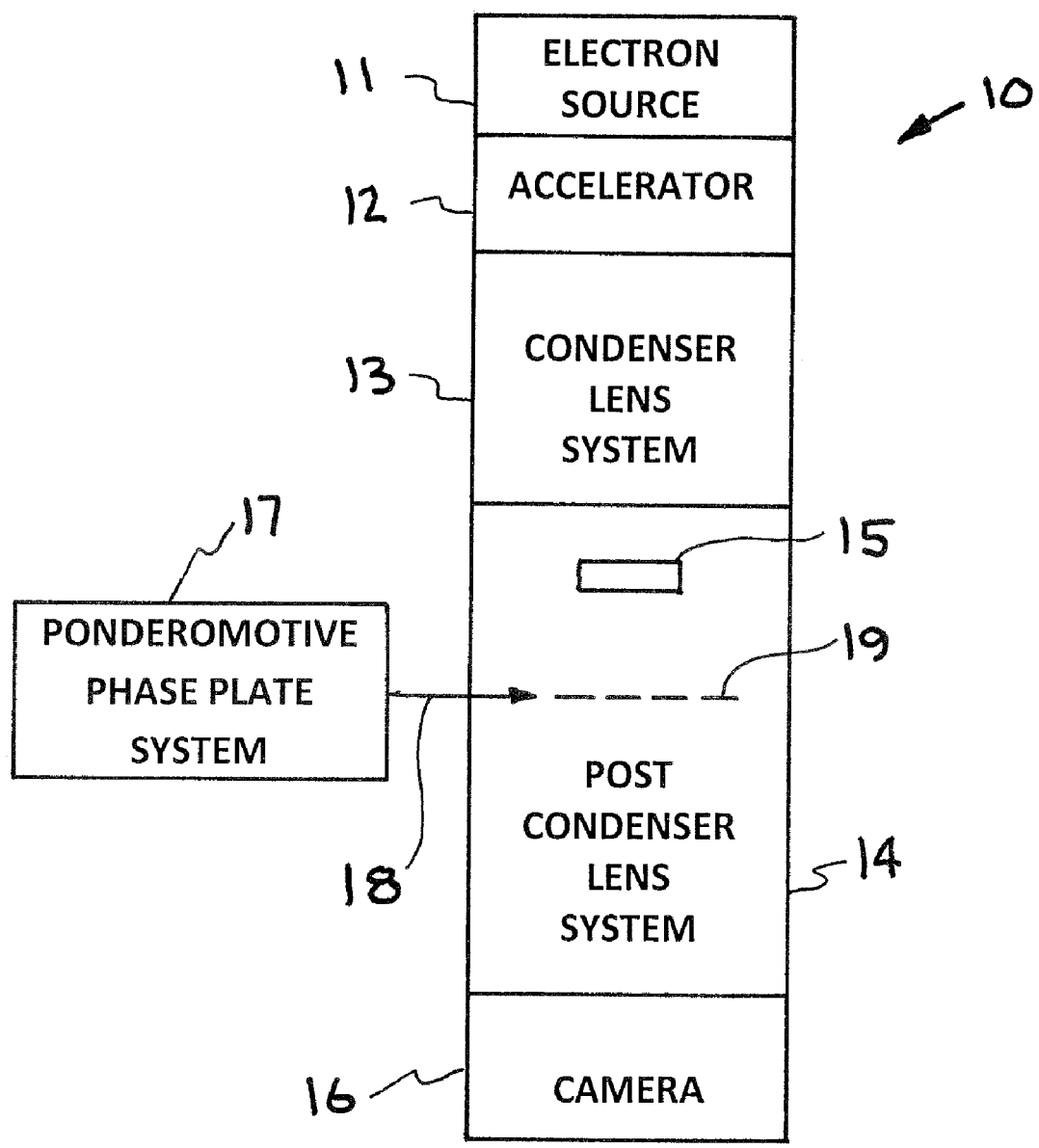
FIG. 1 is a schematic view of a first exemplary embodiment of an improved TEM of the present invention and illustrating the beam transport of a laser into a post-condenser lens system of the TEM for use as a ponderomotive phase plate at a diffraction plane of the post-condenser lens system based on the ponderomotive effect of the laser on a post-sample electron beam.

Turning now to the drawings, FIG. 1 shows a schematic view of a generalized first exemplary embodiment of an improved TEM of the present invention, generally indicated at reference character 10, and including a PPP system 17 integrated as a sub-system of the improved TEM. In the alternative, FIG. 1 may also be characterized as schematically showing the general case of how a PPP system 17 of the present invention may be used with and incorporated into existing TEM columns.

In either case, FIG. 1 schematically shows five basic TEM column modules known in the art and common to most TEM arrangements, including: an electron source 11, such as an electron gun, for producing an electron beam/bunch at a furthest upstream location, an accelerator 12 for accelerating the electron beam down the TEM column, a condenser lens system 13 for primary beam formation of the electron beam, a post-condenser lens system 14 for focusing the electron beam onto a sample and providing post-sample electron beam transport, and a camera 16 at a furthest downstream location for producing an image of the sample from the post-sample electron beam. It is appreciated that the post-condenser lens system is a generalized characterization of all the lens systems which follow the condenser lens system (i.e. is downstream of the condenser lens system along the electron beam drift path), including an objective lens system (not shown), and any additional lens systems, such as the intermediate and projector lens systems (hereinafter "intermediate/project lens system", not shown) which ultimately focuses and projects the electron beam onto a camera. A sample holder/stage 15 is generally shown positioned in the post-condenser lens system 14, but is not characterized as an independent TEM column module because it is commonly provided within the objective lens system, typically as a structurally integrated feature of an objective lens component.

In addition to these five basic TEM column modules, the PPP system 17 is shown provided to produce and transport a laser beam 18 ("ponderomotive laser") into a post-sample drift space of the post-condenser lens system 14 as a focused laser crossover (not shown) that intersects and partially overlaps a post-sample electron beam at a diffraction plane 19 of the post-condenser lens system 14 so that a ponderomotive potential of the focused laser crossover produces a scattering-angle-dependent phase shift in the electrons of the post-sample electron beam corresponding to a phase contrast transfer function. The diffraction plane 19 is shown in FIG. 1 at a downstream position from sample holder/stage 15, which may be at (or substantially near) the back focal plane of the objective lens, or at (or substantially near) an image of this focal plane occurring further downstream in the TEM column, i.e. somewhere in the intermediate/projecting lens system.

Figure 2:
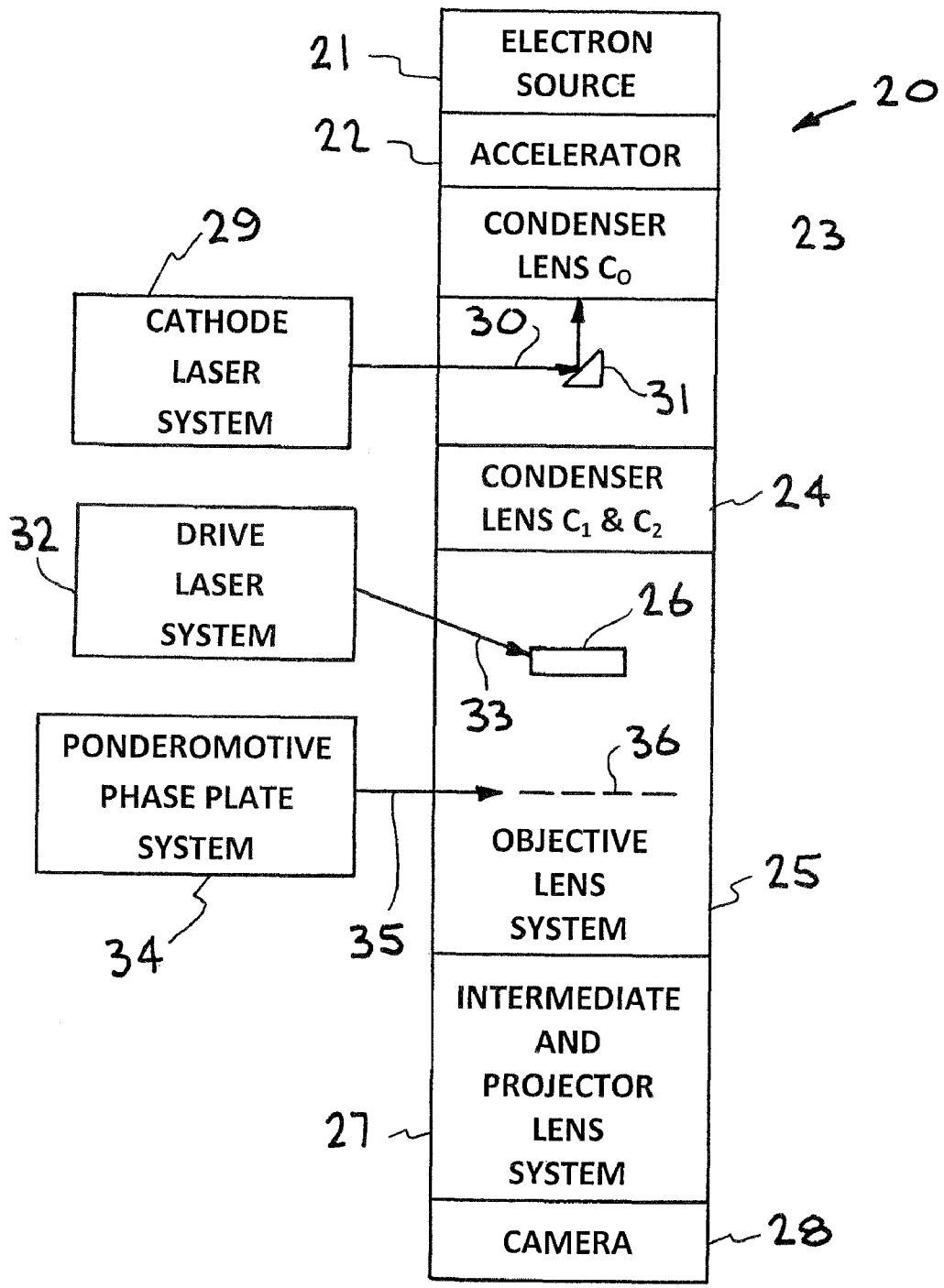
FIG. 2 is a schematic view of a second exemplary embodiment of an improved TEM of the present invention and illustrating the beam transport of a laser into an objective lens system of the TEM for use as a ponderomotive phase plate at a back focal plane of the objective lens system based on the ponderomotive effect of the laser on a post-sample electron beam.

FIG. 2 shows a schematic view of a second exemplary embodiment of the improved TEM of the present invention, generally indicated at reference character 20, and modified to include a PPP system 34 as a sub-system thereof. Similar to FIG. 1, FIG. 2 may also be alternatively characterized as schematically showing how the PPP system 34 of the present invention may be used with and incorporated into the type of TEM column shown in FIG. 2.

In particular, FIG. 2 schematically shows seven basic TEM column modules known in the art, including: an electron source 21 for producing an electron beam/bunch at a furthest upstream location, an accelerator 22 for accelerating the electron beam down the TEM column, a first condenser lens system 23 including lens $C_0$, a second condenser lens system 24 including lens $C_1$ and $C_2$, wherein the $C_0$, $C_1$, and $C_2$ condenser lenses are for primary beam formation of the electron beam, an objective lens system 25 for focusing the electron beam onto a sample, an intermediate/projector lens system 27 for providing post-sample electron beam transport, and a camera 28 at a furthest downstream location for producing an image of the sample from the post-sample electron beam. A sample holder/stage 26 is shown positioned in the objective lens system 25. The TEM column of FIG. 2 also shows a sample drive laser system 32 arranged to produce a laser beam 33 ("drive laser") for initiating a sample reaction or process to be imaged. And a cathode laser system 29 is also provided to produce a laser beam 30 ("cathode laser") which targets the electron source via a mirror 31 to trigger the release of electrons. The cathode laser 30 is shown entering the TEM column generally at the condenser lens system (i.e. between the $1^{st}$ and $2^{nd}$ condenser lens systems) between the accelerator region 22 and the objective lens system 25.

In addition to the seven TEM column modules, the PPP system 34 is shown provided to produce and transport a laser beam 35 ("ponderomotive laser") into a post-sample drift space of the objective lens system 25 as a focused laser crossover (not shown) that intersects and partially overlaps a post-sample electron beam at or substantially near a back focal plane 36 of the objective lens so that a ponderomotive potential of the focused laser crossover produces a scattering-angle-dependent phase shift in the electrons of the post-sample electron beam corresponding to a phase contrast transfer function. It is appreciated that both the drive laser 33 and the ponderomotive laser 35 are synchronized to the cathode laser 30 so that the imaging occurs at a particular time of the reaction (e.g. 20 usecs after initiation).

Figure 3A:
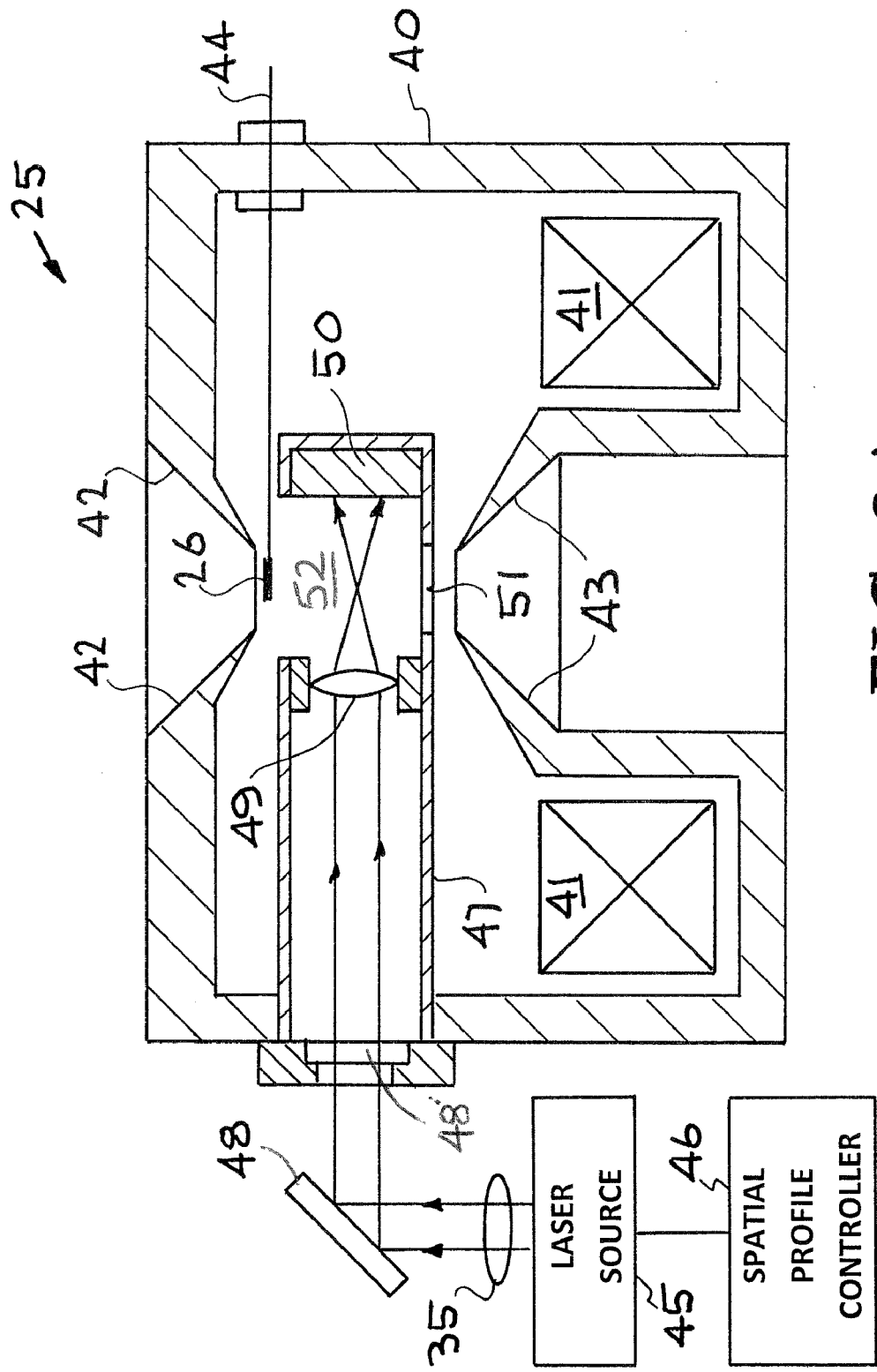
FIG. 3A is a schematic side view of an exemplary embodiment of the ponderomotive phase plate system of the present invention illustrating a beam transport arm which carries a focusing lens and a beam dump for transporting a laser into an objective lens module as a focused laser crossover at a back focal plane of the objective lens.
Figure 3B:
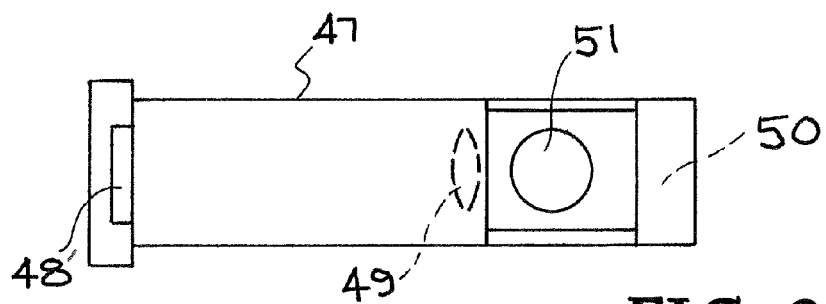
FIG. 3B is a top view of the beam transport arm of FIG. 3A.

FIGS. 3A and 3B show a first exemplary embodiment of the PPP system of the present invention, generally indicated at reference character 25. As previously discussed, the PPP system generally includes a laser source for producing a laser beam ("ponderomotive laser"), and a beam transport system for transporting the laser beam into the TEM column as a focused laser crossover. Optionally, the PPP system may also include a post-condenser lens body modified to operably connect with and support the beam transport system within the post-condenser lens body. In this regard, the PPP system 25 shown in FIG. 3A may be characterized as including only the laser source 35 and the beam transport system (including the mirror 48, the window 48', the beam transport arm 47, and the focusing lens 49) which is adapted to operably connect to an existing objective lens system. Alternatively, the PPP system 25 may also be characterized as additionally including the objective lens body 40 that is adapted to receive and support the beam transport system via an access port. The objective lens body 40 is shown as being a part of an objective lens unit module which additionally includes coils 41, pre-sample objective lens 42, post-sample objective lens 43, and a sample stage/holder 26 with arm 44.

In FIGS. 3A and 3B, the beam transport arm 47 is shown extending into the objective lens body 40 with a first end connected to the objective lens body 40 at the access port thereof, and a second end adjacent a post-sample electron beam drift space 52. A transparent window 48' is positioned at the first end through which the ponderomotive laser beam 35 may enter the post-sample electron beam drift space 52. And a focusing lens 49 and a beam dump 50 is carried by the beam transport arm 47 and positioned on opposite sides of the electron beam drift space 52 so that the ponderomotive laser beam 35 is focused by the focusing lens 49, intersected and partially overlapped with a post-sample electron beam propagating in the drift space 52, and captured by the beam dump 50. The beam transport arm 47 includes an aperture 51 between the focusing lens 49 and the beam dump 50 to enable the electron beam to continue propagating downstream towards an imaging camera. It is appreciated that the focusing lens 49 is representative of additional devices and implements, such as electro-mechanical actuators and controls, necessary for aligning and focusing the laser crossover at a desired position along the back focal plane. Preferably the focusing lens 49 operates to position the focused laser crossover so that it intersects the crossover point for all electrons emerging from the sample in parallel with the longitudinal axis of the TEM column. FIG. 3A also shows the PPP system 25 additionally including a spatial profile controller 46 connected to the laser source 45 for controlling a spatial profile of the focused laser crossover to control the ponderomotive potential thereof and consequently the phase-contrast transfer function of the TEM. It is appreciated that while not shown in the figures, the spatial profile controller 46 may be additionally connected to control the beam transport system, including the positioning of the focus lens 49.

Figure 4:
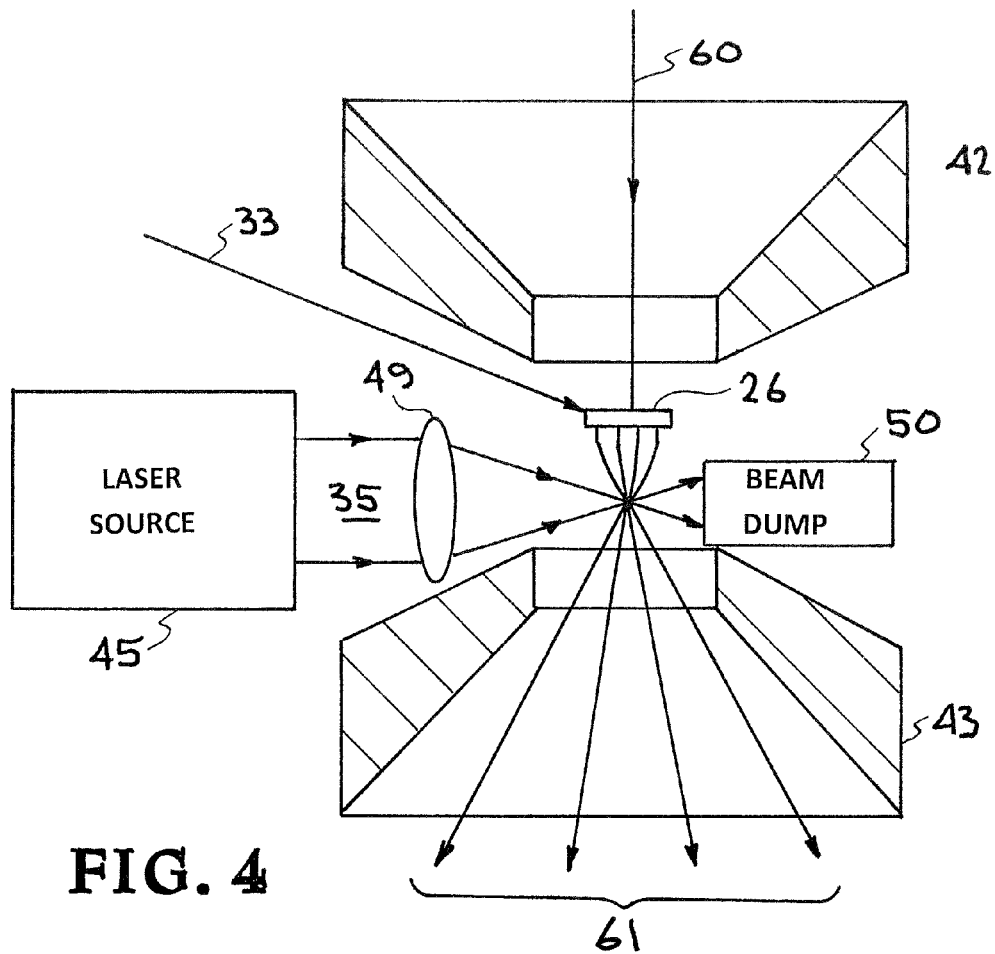
FIG. 4 is a schematic side view of the ponderomotive phase plate system of FIG. 3A illustrating the beam paths of a drive laser beam for driving a sample process/reaction, an electron beam both pre-sample and post-sample, and the ponderomotive phase plate laser beam and focused laser crossover.

FIG. 4 shows a schematic side view of the PPP system of FIG. 3A illustrating the beam paths of a drive laser beam 33 for driving a sample process/reaction, an electron beam both pre-sample 60 and post-sample 61, and the ponderomotive laser beam 35 and focused laser crossover produced by the laser source 45 and beam transport system, represented by focusing lens 49. The pre-objective and post-objective lenses are shown at 42 and 43 respectively. In particular, the objective lens (42, 43) operates to focus electrons scattered from the sample 26 onto the back focal plane (not shown). FIG. 4 particularly shows the beam path of electrons emerging parallel to the longitudinal axis and how they are focused to a representative electron beam crossover point at the back focal plane. It is this electron beam crossover point that the beam transport system of the present invention positions the focused laser crossover (produced from laser beam 35) so as to intersect and partially overlap the electron beam crossover point.

Figure 5:
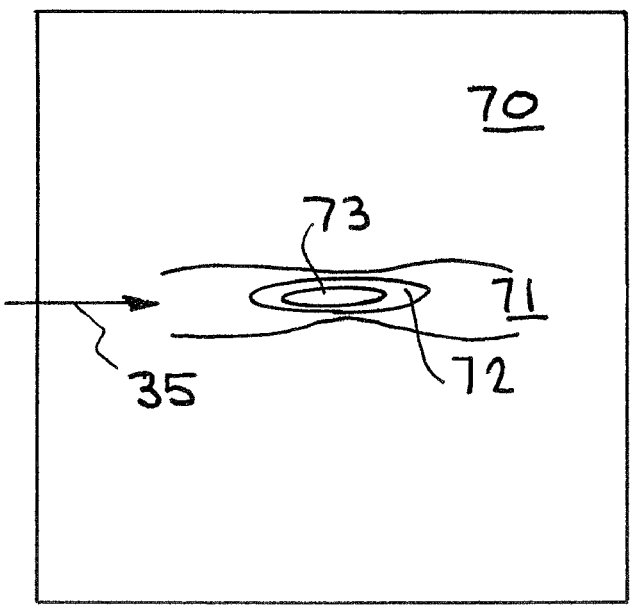
FIG. 5 is an image showing the various ponderomotive phase shift regions due to the ponderomotive effect of an exemplary single-axis design of the PPP system of the present invention.
Figure 6:
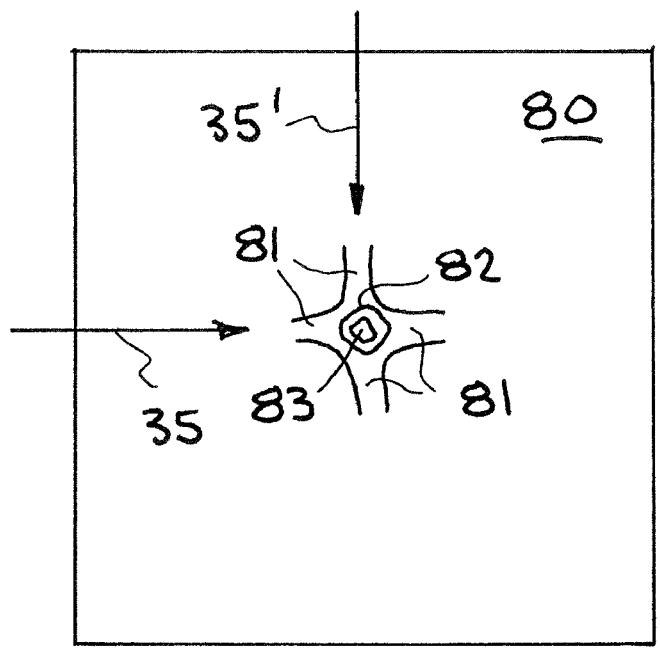
FIG. 6 is an image showing the various ponderomotive phase shift regions due to the ponderomotive effect of an exemplary dual-axis design of the PPP system of the present invention.

When the electron beam arrives and intersects the focused laser crossover, the electrons will experience a scattering-angle-dependent phase shift produced by the ponderomotive potential of the laser crossover (see FIGS. 5 and 6, for example). To a good approximation, the phase shift is proportional to the time integral of the square of the electric field experienced by each electron, so the phase shift can be made much larger near the crossover than far from the center. While there are many aspects of photon-electron interactions, for our purposes the time-averaged ponderomotive potential is the most important. This potential energy function, which is directly proportional to the time-averaged laser intensity, can be derived in many ways that all yield the same result. In a classical model, the oscillating electromagnetic field produces small oscillations in the path of an electron. If the time-averaged field intensity is not uniform, this introduces an asymmetry in the oscillations such that there is a gradual drift away from the regions of high intensity. For our purposes, however, a quantum-mechanical model is more appropriate since the classical model is somewhat misleading; the electrons do not in fact follow such well-defined trajectories, and the net energy change of the electron is guaranteed by symmetry and conservations laws to be negligible (apart from rare events such as Compton scattering and near-field de-excitation of cavity modes). A fairly simple quantum mechanical derivation may be performed with textbook methods by using the relativistically correct kinematics of the electron in terms of the momentum operator and the second-quantized vector potential operator. In particular, a time-independent term arises naturally in this formalism. This term acts exactly as a static potential energy field directly proportional to the time-averaged laser intensity.

The result is that electrons passing through the intense part of the focused laser crossover are slightly retarded, which in terms of wave propagation is equivalent to their acquiring a phase lag. Therefore, for the ponderomotive phase plate geometry with the highest laser intensity at small radial positions, the phase shift is most pronounced at small radial positions and smoothly approaches zero at large radial positions. In the typical mode of operation, small-angle electrons will be phase shifted by 90 degrees and large-angle electrons by 0 degrees, with a smooth transition in between. This will produce a CTF with an unusually broad band of useable spatial frequencies. Other operating modes are possible. For example, the user may want to phase shift certain Bragg spots (to modulate the contrast associated with specific classes of defects) or certain large regions in transverse momentum space. If the laser alignment and focusing system has enough degrees of freedom, these things would all be possible. This is precisely the kind of phase shift function that will produce a good phase-contrast image. Because the phase-versus-radius function is smooth, the image should lack the peculiar artifacts arising from the sharp radial cutoff present in Boersch and Zernike phase plates. Because the focused laser crossover size can be controlled externally (with variable apertures and moveable lenses placed within the laser system), this also affords a degree of control that is difficult to achieve with a solid phase plate of fixed dimensions.

FIGS. 5 and 6 illustrate two examples of the ponderomotive phase shift produced by the focused laser crossover of the present invention. In particular, FIG. 5 shows the ponderomotive phase shift as a function of an electron's position in the back focal plane of the objective lens in a single-axis design (i.e. having a single ponderomotive laser beam producing the laser crossover), and FIG. 6 shows the ponderomotive phase shift as a function of an electron's position in the back focal plane of the objective lens in a dual-axis design (i.e. having two transversely-oriented ponderomotive laser beams together producing the focused laser crossover). In particular, in FIG. 5, region 70 experiences zero phase shift, while regions 71, 72, and 73 experience progressively greater phase shifts. And in FIG. 6, region 80 experiences zero phase shift, while regions 81, 82, and 83 experience progressively greater phase shifts. FIG. 6 in particular illustrates how improved rotational symmetry can be achieved by using more than one laser beam, each viewing the focal point from a different angle. If these multiple entry points all have independent beam intensity controls, this can also give the user control over a multipole expansion of the phase shift as a function of position. This is the essential operating physics for an aberration corrector, and there is the possibility that the PPP system could also be used for astigmatism and aberration correction.

After the beam has passed through the PPP system, the remainder of the electron-optical image forming process occurs in the usual way, but because of the manner in which the phase shifting was produced, the phase-contrast CTF can be dramatically improved, extending from very low to very high spatial frequencies, and tailored to the experiment, which may for example benefit from images that have some linear combination of amplitude and phase contrast.

When the PPP system of the present invention is operated in pulsed mode, i.e. a pulsed laser crossover is produced, the required laser pulse energy depends on the electron kinetic energy, the laser wavelength, the three-dimensional crossover shape and size, and the pulse duration. The system is compatible with a high-frequency stroboscopic operating mode, a single-shot mode (with some engineering challenges, but still possible), or anything in between; all that is required is that the laser pulse be present when the electron pulse arrives at the appropriate point in the column. Normally the pulsed would be temporally flat-topped or nearly so, so that the full duration of the electron pulse experiences a phase shift that is independent of time. Specialized applications (including a ponderomotive streak camera) may make use of other pulse shapes. For example, the pulse energy has been estimated for the application on the LLNL DTEM. The electron kinetic energy is 200 keV, the pulse duration is roughly 10 ns, the required spot size is of order 1 micrometer in radius, and the available laser was a wavelength of 1.06 micrometers. The pulse energy for this application comes to ~0.5 mJ, which is quite attainable with commonly available laser systems. The peak power is many kilowatts, but because of the low duty cycle of the DTEM the average power is only a few milliwatts. These performance parameters are comparable to those of the lasers already connected to the DTEM, so we anticipate no essential difficulty in developing the technique.

While particular operational sequences, materials, temperatures, parameters, and particular embodiments have been described and or illustrated, such are not intended to be limiting. Modifications and changes may become apparent to those skilled in the art, and it is intended that the invention be limited only by the scope of the appended claims.

I claim:

1. A ponderomotive phase plate system for use in a transmission electron microscope (TEM) for high-resolution phase contrast imaging, comprising:
    a laser source for producing a laser beam; and
    means for transporting said laser beam into a post-sample electron beam drift space of a post-condenser lens system of said TEM as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

2. The ponderomotive phase plate system of claim 1, further comprising:
    means for controlling a spatial profile of said focused laser crossover to control the ponderomotive potential of said focused laser crossover and thereby tailor the scattering-angle-dependent phase shift in the electrons of said post-sample electron beam corresponding to a desired phase contrast transfer function.

3. The ponderomotive phase plate system of claim 1, further comprising:
    a post-condenser lens body of said post-condenser lens system surrounding the post-sample electron beam drift space and having a port providing access to the post-sample electron beam drift space with said means for transporting operably connected to said port.

4. The ponderomotive phase plate system of claim 1, further comprising:
means for transporting a second laser beam into the post-sample electron beam drift space as a second focused laser crossover that intersects and partially overlaps the post-sample electron beam at the diffraction plane substantially transverse to the first laser beam so that the ponderomotive potentials of said first and second focused laser crossovers produce a scattering-angle-dependent phase shift in the electrons of said post-sample electron beam corresponding to a phase contrast transfer function.

5. The ponderomotive phase plate system of claim 1, further comprising:
a beam dump for capturing the laser beam after intersecting with the post-sample electron beam.

6. The ponderomotive phase plate system of claim 1,
wherein the diffraction plane is a back focal plane of an objective lens system of said post-condenser lens system of said TEM.

7. The ponderomotive phase plate system of claim 1,
wherein said laser source is a pulsed laser source for producing a pulsed laser beam.

8. An improved transmission electron microscope (TEM) for high-resolution phase contrast imaging, said TEM of a type having an electron source for producing an electron beam, an accelerator for accelerating the electron beam, a condenser lens system for primary beam formation of the electron beam, a sample stage for holding a sample, a post-condenser lens system for focusing the electron beam onto the sample and projecting the post-sample electron beam, and a camera for imaging the sample from the projected post-sample electron beam, the improvement comprising:
a laser source for producing a laser beam; and
means for transporting said laser beam into a post-sample electron beam drift space of the post-condenser lens system via a port in a post-condenser lens body thereof as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

9. The improved TEM of claim 8, wherein the improvement further comprises:
means for controlling a spatial profile of said focused laser crossover to control the ponderomotive potential of said focused laser crossover and thereby tailor the scattering-angle-dependent phase shift in the electrons of said post-sample electron beam corresponding to a desired phase contrast transfer function.

10. The improved TEM of claim 8, wherein the improvement further comprises:
means for transporting a second laser beam into the post-sample electron beam drift space as a second focused laser crossover that intersects and partially overlaps the post-sample electron beam at the diffraction plane substantially transverse to the first laser beam so that the ponderomotive potentials of said first and second focused laser crossovers produce a scattering-angle-dependent phase shift in the electrons of said post-sample electron beam corresponding to a phase contrast transfer function.

11. The improved TEM of claim 8, wherein the improvement further comprises:
a beam dump for capturing the laser beam after intersecting with the post-sample electron beam.

12. The improved TEM of claim 8,
wherein the diffraction plane is a back focal plane of an objective lens system of said post-condenser lens system of said TEM.

13. The improved TEM of claim 8,
wherein said laser source is a pulsed laser source for producing a pulsed laser beam.

14. A method of controlling a phase-contrast transfer function of a transmission electron microscope (TEM) for high-resolution phase contrast imaging, comprising:
transporting said laser beam into a post-sample electron beam drift space of a post-condenser lens system of said TEM as a focused laser crossover that intersects and partially overlaps the post-sample electron beam at a diffraction plane so that a ponderomotive potential of said focused laser crossover produces a scattering-angle-dependent phase shift in the electrons of said post-sample electron beam corresponding to a phase contrast transfer function.

15. The method of claim 14, further comprising:
controlling a spatial profile of said focused laser crossover to control the ponderomotive potential of said focused laser crossover and thereby tailor the scattering-angle-dependent phase shift in the electrons of said post-sample electron beam corresponding to a desired phase contrast transfer function.

16. The method of claim 14, further comprising:
wherein said laser beam is transported into the post-sample electron beam drift space of the post-condenser lens system of said TEM via a port in a post-condenser lens body of said post-condenser lens system surrounding the post-sample electron beam drift space.

17. The method of claim 14, further comprising:
transporting a second laser beam into the post-sample electron beam drift space as a second focused laser crossover that intersects and partially overlaps the post-sample electron beam at the diffraction plane substantially transverse to the first laser beam so that the ponderomotive potentials of said first and second focused laser crossovers produce a scattering-angle-dependent phase shift in the electrons of said post-sample electron beam corresponding to a phase contrast transfer function.

18. The method of claim 14, further comprising:
using a beam dump to capture the laser beam after intersecting with the post-sample electron beam.

19. The method of claim 14,
wherein the diffraction plane is a back focal plane of an objective lens system of said post-condenser lens system of said TEM.

20. The method of claim 14,
wherein the transported laser beam is a pulsed laser beam.

* * * * *